US007705703B2

(12) United States Patent
Tsao

(10) Patent No.: US 7,705,703 B2
(45) Date of Patent: Apr. 27, 2010

(54) SIGNAL DISTRIBUTING INDUCTOR

(75) Inventor: Wei-Chun Tsao, Taipei (TW)

(73) Assignee: Unihan Corporation, Taipei (JP)

( * ) Notice: Subject to any disclaimer, the term of this patent is extended or adjusted under 35 U.S.C. 154(b) by 157 days.

(21) Appl. No.: 11/960,729

(22) Filed: Dec. 20, 2007

(65) Prior Publication Data

US 2008/0150667 A1 Jun. 26, 2008

(30) Foreign Application Priority Data

Dec. 22, 2006 (TW) .............................. 95148396 A

(51) Int. Cl.
*H01F 27/29* (2006.01)
*H01F 27/24* (2006.01)
*H01F 27/06* (2006.01)
*H01F 5/00* (2006.01)
*H01F 21/06* (2006.01)
*H05K 7/02* (2006.01)

(52) U.S. Cl. ......................... 336/192; 336/212; 336/65; 336/200; 336/131; 361/807

(58) Field of Classification Search ....................... None
See application file for complete search history.

(56) References Cited

U.S. PATENT DOCUMENTS 3,315,087 A * 4/1967 Ingenito ..................... 377/101
3,423,710 A * 1/1969 Allen .......................... 336/155
3,449,704 A * 6/1969 Matsushima et al. ......... 336/175
3,641,464 A * 2/1972 Crowhurst et al. .......... 333/112
3,766,499 A * 10/1973 Dillenberger ............... 333/112
4,030,058 A 6/1977 Riffe et al.
4,119,914 A * 10/1978 Duncan ....................... 455/331
4,760,366 A 7/1988 Mitsui
6,320,492 B1 * 11/2001 Kubomura et al. .......... 336/213
6,346,673 B1 2/2002 Onizuka
6,668,444 B2 12/2003 Ngo et al.
6,876,555 B2 4/2005 Matsumoto et al.
7,158,003 B2 * 1/2007 Cern et al. .................. 336/175
2002/0048159 A1 * 4/2002 Tsao et al. .................. 361/807
2004/0119577 A1 * 6/2004 Weger ........................ 336/229

* cited by examiner

*Primary Examiner*—Elvin G Enad
*Assistant Examiner*—Mangtin Lian
(74) *Attorney, Agent, or Firm*—Jianq Chyun IP Office

(57) ABSTRACT

A signal distribution inductor is suitable to be adsorbed by a surface mounting technology (SMT) apparatus. The signal distribution inductor includes a base, a separated iron-core, and a plurality of induction coils. The separated iron-core includes a first induced body and a second induced body, wherein the first induced body and the second induced body are provided at the base. The first induced body and the second induced body are joined together to form a joining surface through which the signal distribution inductor is adsorbed by the SMT apparatus. In addition, the first induced body has a first through hole, and the second induced body has a second through hole. The induction coils are wound on the first induced body, the second induced body and the base through the first through hole, the second through hole.

9 Claims, 4 Drawing Sheets

300

SIGNAL DISTRIBUTING INDUCTOR

CROSS-REFERENCE TO RELATED APPLICATION

This application claims the priority benefit of Taiwan application serial No. 95148396, filed on Dec. 22, 2006. The entirety of the above-mentioned patent application is hereby incorporated by reference herein and made a part of this specification.

BACKGROUND OF THE INVENTION

1. Field of the Invention

The invention relates to an inductor and, more particularly, to a signal distribution inductor.

2. Description of the Related Art

Along with the development of the electronic telecommunication and the Internet, it is necessary to distribute telecommunication routes to facilitate usage of more users. For example, since cable television lines are always distributed as a tree network system, cable television proprietors need to equivalently distribute the lines at each point of branching. Then, each user can get the same service.

FIG. 1 is a schematic diagram showing a conventional two signal distribution inductors which are provided at a circuit board. Please refer to FIG. 1, the induced bodies 112 and 122 of conventional signal distribution inductors 110 and 120 are provided from winding a coil 114 and a coil 124 on a circuit board 10, and then a group of branch circuits are formed. However, the above branch circuits only satisfy a conventional electrical standard, and cannot completely satisfy the electrical standard of two-way digital transmission signals of the present cable televisions. In addition, since the steps of winding coils and assembling the signal distribution inductor 110 and 120 to the circuit board 10 are processed by manual operation, a lot of manpower costs and assembly time are consumed. On the other hand, the quality of the signal distribution inductor may decrease because of careless mistakes of manual operation.

FIG. 2A is a schematic diagram showing another conventional signal distribution inductor which is assembled to a circuit board. Please refer to FIG. 2A, and a conventional signal distribution inductor 200 mostly includes a base 210, a induced body 220 and a plurality of coils 230. The base 210 has a plurality of pins 212 and the induced body 220 has a plurality of through holes 222 (two through holes are shown in FIG. 2A). In FIG. 2A, the coils 230 are wound on the pins 212 and through the through holes 222, wherein the coils 230 are electrically connected to the corresponding pins 212 which are electrically connected to a circuit board 20. The technology only needs one induced body 220 to distribute signals, so the process for assembling the signal distribution inductor 200 to the circuit board 20 is simplified. In addition, the conventional signal distribution inductor 200 has an adsorbing surface 240, the adsorbing surface 240 of the signal distribution inductor 200 can adsorb the circuit board 20 in a machine for surface mounting process. Compared with assembling the signal distribution inductor 200 to the circuit board 20 by the manual operation, the technology has preferred process efficiency and process quality. However, since the above signal distribution inductor 200 only has one induced body 220, when the signal distribution inductor 200 is working, it is easy to form a closed magnetic loop in the induced body, so that a magnetic saturation phenomenon occurs (please refer to FIG. 2B which is a schematic diagram showing the closed magnetic loop generated in the induced body 220 shown in FIG. 2A.) and the work efficiency of the signal distribution inductor 200 decreases.

BRIEF SUMMARY OF THE INVENTION

One objective of the invention is to provide a signal distribution inductor which has preferred work efficiency.

Another objective of the invention is to provide a signal distribution inductor which can be assembled to a circuit board by a surface mounting technology (SMT) to enhance product quality and process efficiency.

To achieve the above or other objectives, the invention provides a signal distribution inductor which is adsorbed by a SMT apparatus. The signal distribution inductor includes a base, a separated iron-core and a plurality of induction coils. Wherein the separated iron-core includes a first induced body and a second induced body which are provided at the base. The first induced body and the second induced body are joined together to form a joining surface to adsorb the SMT apparatus. In addition, the first induced body and the second induced body have a first through hole and a second through hole, respectively, and the induction coils are wound on the first induced body, the second induced body and the base through the first through hole, the second through hole.

In one embodiment of the invention, the base has a plurality of pins and the induction coils are wound on the corresponding pins, respectively.

In one embodiment of the invention, the pins are electrically connected to the corresponding induction coils.

In one embodiment of the invention, the base includes a plurality of fastening portions, and the first induced body and the second induced body include a fastening hole, respectively, and the fastening portions and the fastening holes are wedged together.

In one embodiment of the invention, the induction coils are enameled copper wires.

In one embodiment of the invention, the base is a circuit board base.

In one embodiment of the invention, the base is a ceramic base.

In one embodiment of the invention, the material of the first induced body and the material of the second induced body are the same.

In one embodiment of the invention, the material of the first induced body and the material of the second induced body are different.

In one embodiment of the invention, the material of the first induced body and the second induced body are ferric oxide.

In the signal distribution inductor of the invention, the first induced body and the second induced body which are disposed on the base are joined together (the first induced body and the second induced body may be joined together by viscose or other appropriate methods), and the induction coils are wound on the first induced body, the second induced body and the base through the first through hole of the first induced body and the second through hole of the second induced body. Since the first induced body and the second induced body are joined together and disposed on the base, when the signal distribution inductor is working, a magnetic resistance layer (the magnetic resistance layer is, for example, air layer or the viscose layer) is formed between the first induced body and the second induced body. The magnetic resistance layer causes the magnetic resistance between the first induced body and the second induced body to greatly increase. In this way, the signal distribution inductor can afford a high input power, so that the signal distribution inductor can have preferred work efficiency.

In addition, since the first induced body and the second induced body are two independent individuals, the work frequency range of the signal distribution inductor can be adjusted by changing the material of the first induced body and the second induced body in the invention. In addition, the first induced body and the second induced body which are joined together have an adsorbing surface, and the SMT apparatus can adsorb the adsorbing surface of the signal distribution inductor to operate a surface mounting process (SMP). In this way, the signal distribution inductor of the invention can have preferred product quality and work efficiency.

These and other features, aspects, and advantages of the present invention will become better understood with regard to the following description, appended claims, and accompanying drawings.

DESCRIPTION OF EMBODIMENTS

Figure 1:
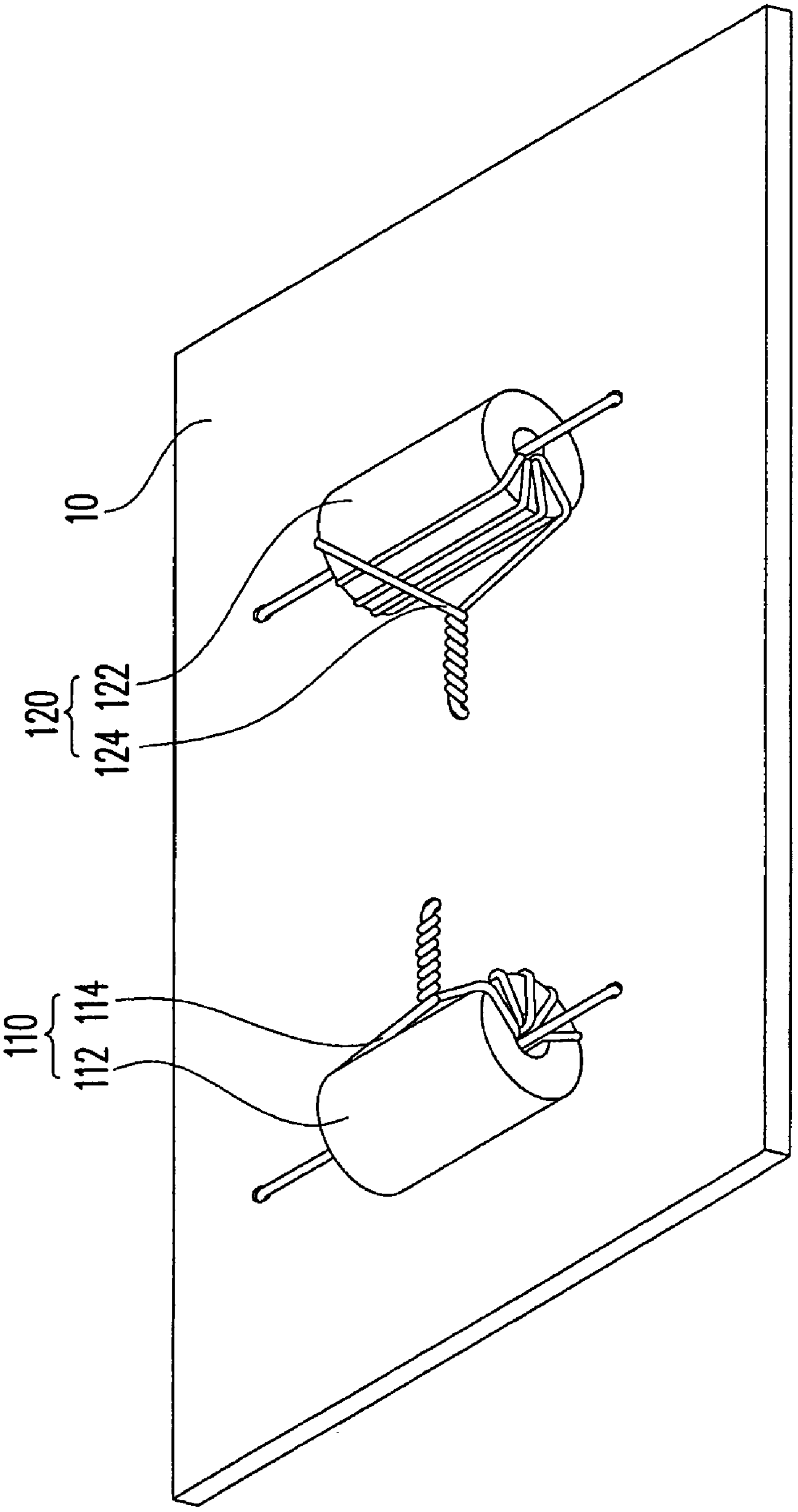
FIG. 1 (PRIOR ART)
FIG. 1 is a schematic diagram showing a conventional two signal distribution inductors which are provided at a circuit board.
Figure 2A:
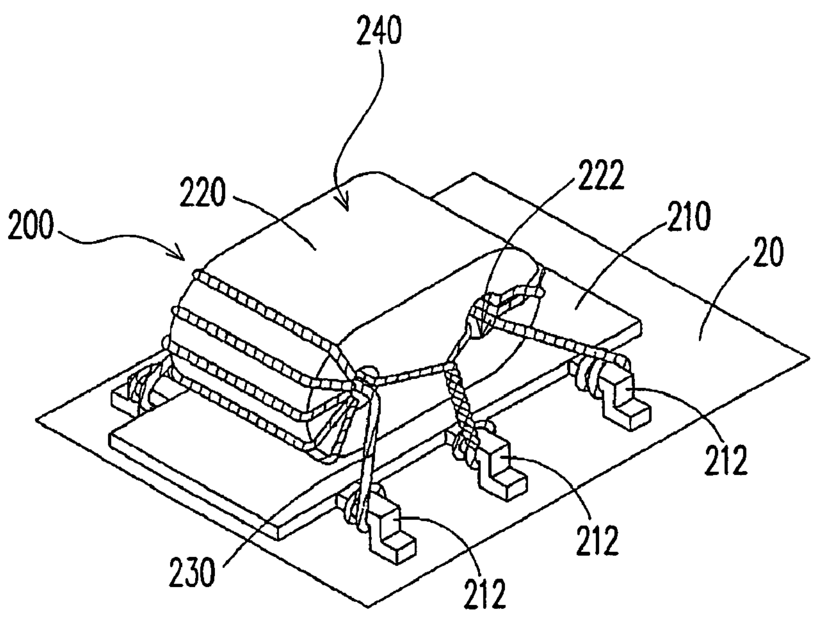
FIG. 2A(PRIOR ART)
FIG. 2A is a schematic diagram showing another conventional signal distribution inductor which is assembled to a circuit board.
Figure 2B:
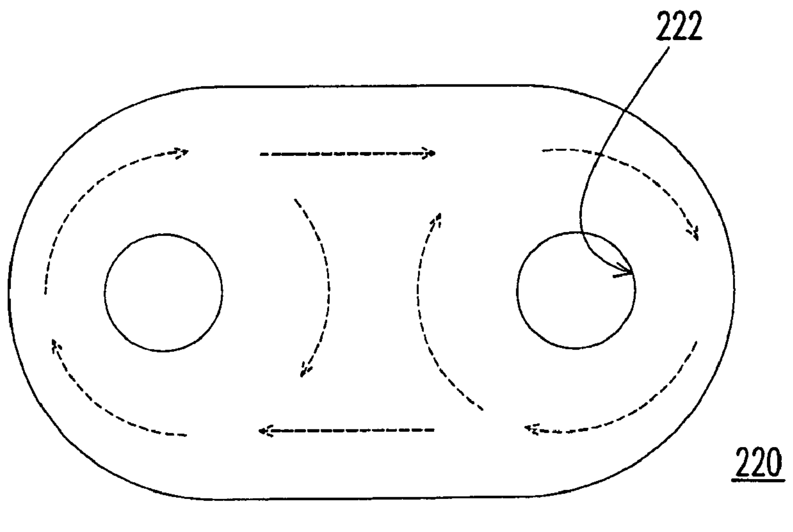
FIG. 2B(PRIOR ART)
FIG. 2B is a schematic diagram showing the closed magnetic loop generated in the induced body shown in FIG. 2A.
Figure 3:
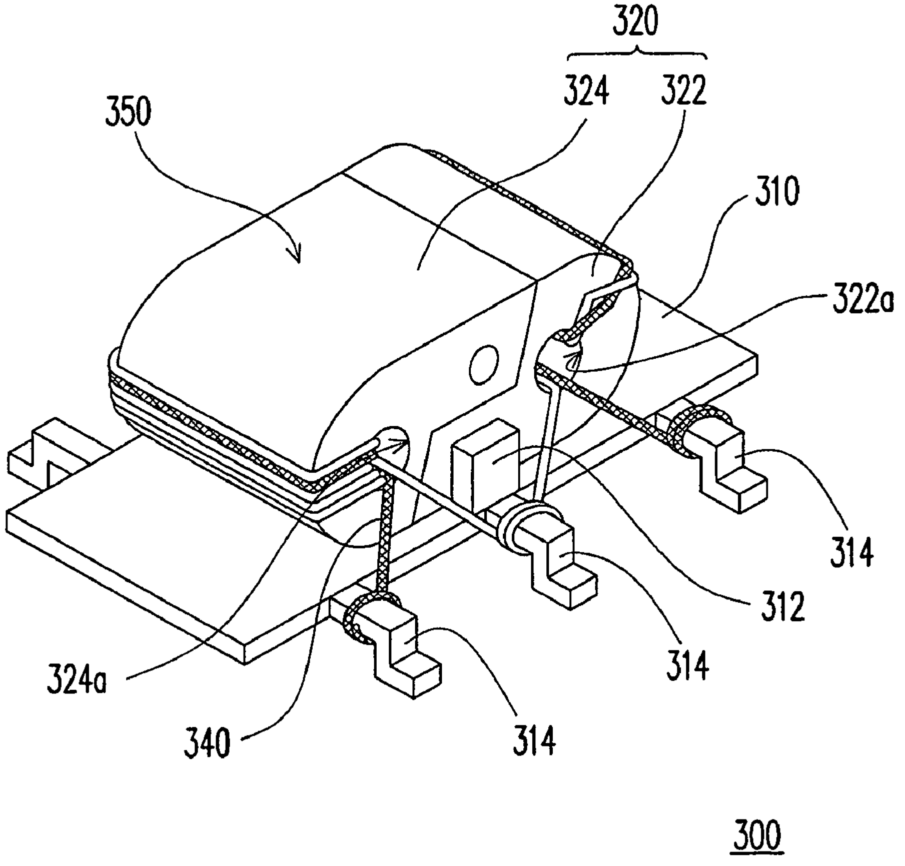
FIG. 3 is a three-dimensional diagram showing a signal distribution inductor in a preferred embodiment of the invention.
Figure 4:
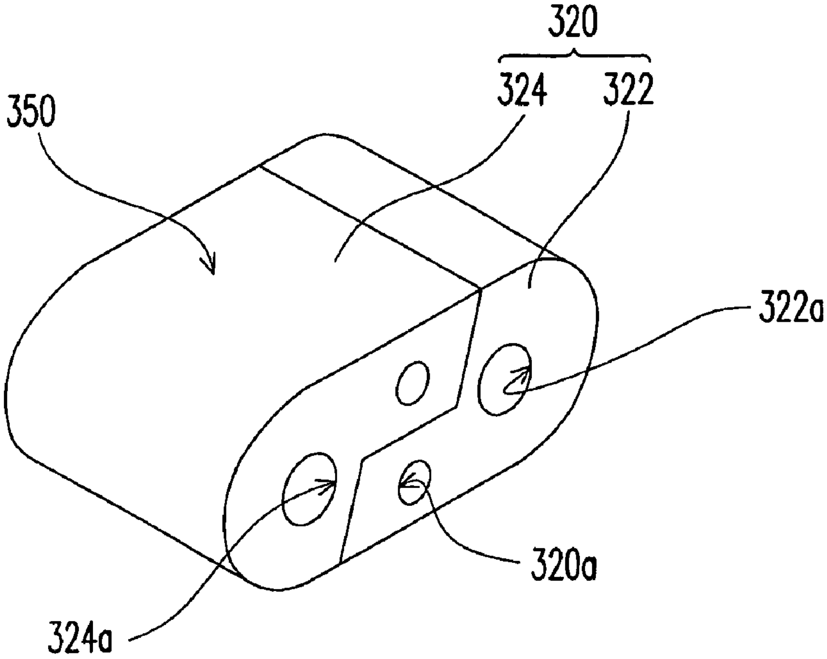
FIG. 4 is a three-dimensional diagram showing the first induced body and the second induced body which are joined together in FIG. 3.
Figure 5:
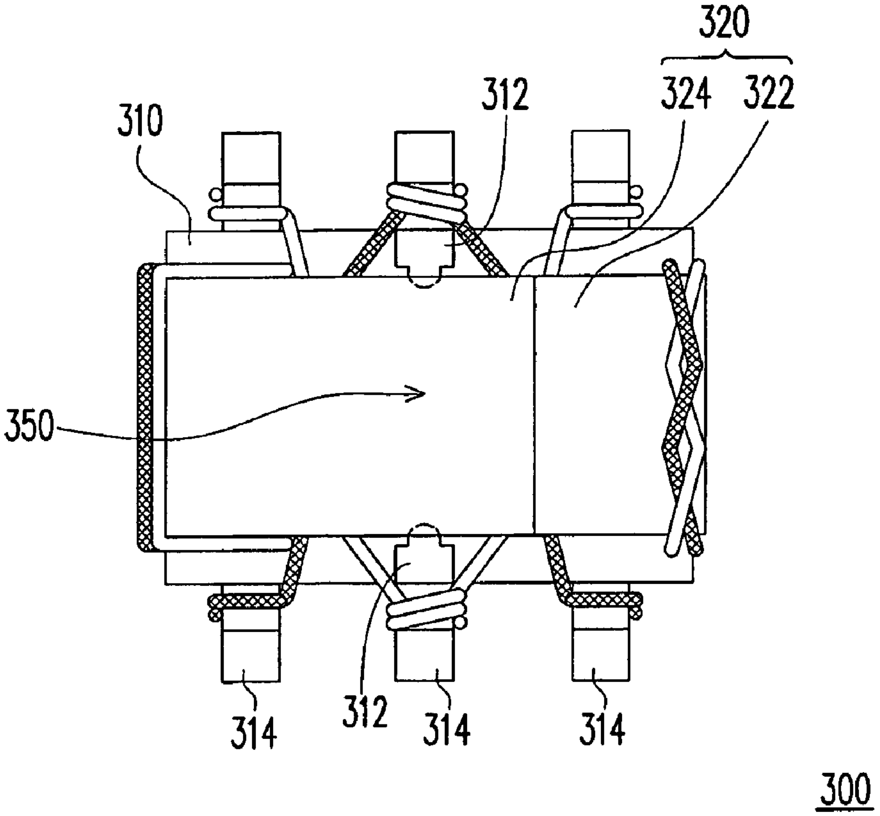
FIG. 5 is a top view of the signal distribution inductor in FIG. 3.

FIG. 3 is a three-dimensional diagram showing a signal distribution inductor in a preferred embodiment of the invention. FIG. 4 is a three-dimensional diagram showing the first induced body and the second induced body which are joined together in FIG. 3. FIG. 5 is a top view of the signal distribution inductor in FIG. 3. Please refer to FIG. 3, FIG. 4 and FIG. 5 simultaneously, and a signal distribution inductor 300 in the embodiment is suitable to be adsorbed by a surface mounting technology (SMT) apparatus (not shown). The signal distribution inductor 300 includes a base 310, a separated iron-core 320 and a plurality of induction coils 340. In the embodiment, the separated iron-core 320 includes a first induced body 322 and a second induced body 324 which are provided at the base 310. Wherein the base 310 is, for example, a circuit board base or a ceramic base, and the first induced body 322 and the second induced body 324 are block bodies composed of, for example, ferric oxide iron-core or other appropriate material. Certainly, in other embodiments, the first induced body 322 and the second induced body 324 can also be composed of different materials, and proprietors can adjust the work frequency range of the signal distribution inductor 300 by changing the material of the first induced body 322 and the second induced body 324.

In the embodiment, the first induced body 322 and the second induced body 324 which are provided on the base 310 are joined together. For example, the first induced body 322 and the second induced body 324 can be joined together by viscose (not shown). Certainly, the first induced body 322 and the second induced body 324 can also be joined together by other appropriate methods. Wherein the first induced body 322 and the second induced body 324 are joined together to form an oval block body. Furthermore, the first induced body 322 and the second induced body 324 which are joined together can form a joining surface 350 which can be adsorbed by a SMT apparatus, and the SMT apparatus can do a surface mounting process (SMP) on the signal distribution inductor 300 by adsorbing the adsorbing surface 350, and then the process efficiency of the signal distribution inductor 300 is increased. In addition, the size and shape of the first induced body 322 can be, for example, the same with that of the second induced body 324, that is, the first induced body 322 and the second induced body 324 can be made by the same mold (not shown), and then manufacture costs are decreased.

From the above, a plurality of fastening portions 312 are provided at the base 310 of the embodiment and the first induced body 322 (or the second induced body 324) has at least one fastening hole 320*a*, wherein the fastening hole 320*a*, for example, passes through the first induced body 322 (or the second induced body 324). The above fastening portions 312 are wedged to the fastening hole 320*a*, and then the first induced body 322 and the second induced body 324 which are joined together can be firmly provided on the base 310.

In addition, in the embodiment, the first induced body 322 and the second induced body 324 have a first through hole 322*a* and a second through hole 324*a*, respectively, and the induction coils 340 such as enameled copper wires are wound on the first induced body 322 and the second induced body 324 and the base 310 through the first through hole 322*a*, the second through hole 324*a*. To illustrate in detail, a plurality of pins 314 can be disposed at the base 310 of the embodiment, and the induction coils 340 are tightly wound at the through hole 322*a*, the second through hole 324*a* and the corresponding pins 314, and the induction coils 340 is electrically connected to the pins 314 which they are wound at. The pins 314 and the induction coils 340 which are wound at the pins 314 can be soldered together, so that the pins 314 are electrically connected to the induction coils 340 which are wound at the pins 314. In addition, in the embodiment, the winding mode of the induction coils 340 is not limited, and proprietors can adjust the winding mode according to usage requirements, so that the signal distribution inductor 300 applies to electronic devices with different usage powers or usage frequency ranges. In addition, the proprietors can also make the signal distribution inductor 300 applied to electronic devices with different usage powers or usage frequency ranges by changing the material or the line width of the induction coils 340.

In the embodiment, since the first induced body 322 and the second induced body 324 which are provided on the base 310 are joined together (the first induced body 322 and the second induced body 324 can be joined together by viscose or other appropriate methods), when the signal distribution inductor 300 is working, a magnetic resistance layer (the magnetic resistance layer is, for example, air or the viscose) is formed between the first induced body 322 and the second induced body 324, so that magnetic energy in the first induced body 322 or the second induced body 324 is obstructed by the magnetic resistance layer when the magnetic energy is transmitted, and the magnetic resistance between the first induced body 322 and the second induced body 324 is greatly increased. In this way, the signal distribution inductor 300 can afford a high input power, so that the signal distribution inductor can have preferred work efficiency.

To sum up, a first induced body and a second induced body which are joined together are provided on a base in the invention, and induction coils are wound among a first through hole of the first induced body, a second through hole of the second induced body and the base. Compared with the conventional technology, the invention has the following advantages.

First, since the first induced body and the second induced body which are provided on the base are joined together, when the signal distribution inductor is working, a magnetic resistance layer (the magnetic resistance layer is, for example, air or the viscose) is formed between the first induced body and the second induced body, and the magnetic resistance between the first induced body and the second induced body is greatly increased, so that the signal distribution inductor can afford a high input power and has preferred work efficiency.

Second, since the first induced body and the second induced body are two independent individuals, the work frequency range of the signal distribution inductor can be adjusted by changing the material of the first induced body and the second induced body in the invention, so that the signal distribution inductor of the invention can be applied to electronic devices with different work frequency ranges.

Third, since the signal distribution inductor of the invention has a adsorbing surface and a SMT apparatus can do a SMP on the signal distribution inductor by adsorbing the adsorbing surface. In this way, the invention can decrease careless mistakes of manual operation and improve low process efficiency of manual operation. That is, the signal distribution inductor of the invention has preferred product quality and work efficiency.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A signal distribution inductor which is capable of being adsorbed by a surface mounting technology (SMT) apparatus, the signal distribution inductor comprising:

a base;

a separated iron-core comprising:

a first induced body which is provided at the base and has a first through hole;

a second induced body which is provided at the base and has a second through hole, wherein the second induced body and the first induced body are joined together to form a joining surface to adsorb the SMT apparatus;

a magnetic resistance layer, adhered between the first induced body and the second induced body, wherein the magnetic resistance layer is a viscose;

a plurality of induction coils which are wound on the first induced body, the second induced body and the base through the first through hole, the second through hole, respectively; and the base comprises a fastening portion, and the first induced body and the second induced body comprise a fastening hole, and the fastening portion and the fastening hole are wedged together.

2. The signal distribution inductor according to claim 1, wherein the base has a plurality of pins, and the induction coils are wound on the pins, respectively.

3. The signal distribution inductor according to claim 2, wherein the pins are electrically connected to the corresponding induction coils.

4. The signal distribution inductor according to claim 1, wherein the induction coils are enameled copper wires.

5. The signal distribution inductor according to claim 1, wherein the base is a circuit board base.

6. The signal distribution inductor according to claim 1, wherein the base is a ceramic base.

7. The signal distribution inductor according to claim 1, wherein the material of the first induced body and the material of the second induced body are the same.

8. The signal distribution inductor according to claim 1, wherein the material of the first induced body and the material of the second induced body are different.

9. The signal distribution inductor according to claim 1, wherein the material of the first induced body and the second induced body are ferric oxide.

* * * * *